US009646125B2

(12) United States Patent
Fifield et al.

(10) Patent No.: US 9,646,125 B2
(45) Date of Patent: May 9, 2017

(54) METHOD FOR CONVERSION OF COMMERCIAL MICROPROCESSOR TO RADIATION-HARDENED PROCESSOR AND RESULTING PROCESSOR

(71) Applicant: INTERNATIONAL BUSINESS MACHINES CORPORATION, Armonk, NY (US)

(72) Inventors: John A. Fifield, Underhill, VT (US); Mark C. Hakey, Fairfax, VT (US); Jason D. Hibbeler, Williston, VT (US); James S. Nakos, Essex Junction, VT (US); Tak H. Ning, Yorktown Heights, NY (US); Kenneth P. Rodbell, Sandy Hook, CT (US); Ronald D. Rose, Essex Junction, VT (US); Henry H. K. Tang, Poughkeepsie, NY (US); Larry Wissel, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 147 days.

(21) Appl. No.: 14/151,866

(22) Filed: Jan. 10, 2014

(65) Prior Publication Data
US 2014/0258958 A1    Sep. 11, 2014

Related U.S. Application Data

(63) Continuation of application No. 12/579,159, filed on Oct. 14, 2009.

(51) Int. Cl.
*G06F 17/50* (2006.01)
*H01L 23/556* (2006.01)
*G06F 11/10* (2006.01)

(52) U.S. Cl.
CPC ...... *G06F 17/5068* (2013.01); *G06F 11/1048* (2013.01); *G06F 17/505* (2013.01)

(58) Field of Classification Search
CPC ............ G06F 2217/70; H03K 19/0033; G01R 31/31816; G01R 31/2881; H01L 23/556
(Continued)

(56) References Cited

U.S. PATENT DOCUMENTS 5,022,027 A    6/1991  Rosario
5,134,616 A  * 7/1992  Barth et al. .................. 714/711
(Continued)

OTHER PUBLICATIONS

J. R. Hauser. "Simulation of Transient Radiation Effects on CMOS ICs". Prevention of Single Event Upsets in Microelectronics, Appendix E, pp. E.1-E.10. Aug. 1991.*
(Continued)

*Primary Examiner* — Vuthe Siek
*Assistant Examiner* — Aric Lin
(74) *Attorney, Agent, or Firm* — David Cain; Andrew M. Calderon; Roberts Mlotkowski, Safran, Cole & Calderon, P.C.

(57) ABSTRACT

A method is provided to convert commercial microprocessors to radiation-hardened processors and, more particularly, a method is provided to modify a commercial microprocessor for radiation hardened applications with minimal changes to the technology, design, device, and process base so as to facilitate a rapid transition for such radiation hardened applications. The method is implemented in a computing infrastructure and includes evaluating a probability that one or more components of an existing commercial design will be affected by a single event upset (SEU). The method further includes replacing the one or more components with a component immune to the SEU to create a final device.

14 Claims, 7 Drawing Sheets

(58) Field of Classification Search
USPC .................................................. 257/297, 921
See application file for complete search history.

(56) References Cited

U.S. PATENT DOCUMENTS

| | | | |
|---|---|---|---|
| 5,260,952 | A | 11/1993 | Beilstein, Jr. et al. |
| 5,995,430 | A | 11/1999 | Yabe |
| 6,157,560 | A | 12/2000 | Zheng |
| 6,339,548 | B1 | 1/2002 | Hazama |
| 7,103,522 | B1* | 9/2006 | Shepard .......................... 703/14 |
| 7,535,213 | B1* | 5/2009 | Lesea .......................... 324/750.3 |
| 7,598,773 | B2 | 10/2009 | Wyatt |
| 8,065,644 | B1* | 11/2011 | Jacobson ............ G06F 17/5054 716/106 |
| 2002/0110027 | A1 | 8/2002 | Nakano et al. |
| 2002/0154553 | A1 | 10/2002 | Shubat et al. |
| 2003/0012053 | A1 | 1/2003 | Chevallier |
| 2003/0028712 | A1 | 2/2003 | Horiguchi et al. |
| 2005/0005203 | A1* | 1/2005 | Czajkowski ..................... 714/47 |
| 2006/0069941 | A1* | 3/2006 | Trantham et al. ................ 714/4 |
| 2006/0119410 | A1* | 6/2006 | Carlson ......................... 327/310 |
| 2006/0194454 | A1* | 8/2006 | Hughes et al. .............. 438/795 |
| 2007/0198873 | A1 | 8/2007 | Ward et al. |
| 2008/0235557 | A1* | 9/2008 | Kim .............................. 714/755 |
| 2008/0281572 | A1* | 11/2008 | Puri et al. ....................... 703/16 |
| 2009/0134925 | A1* | 5/2009 | Cannon et al. .............. 327/210 |
| 2011/0025372 | A1* | 2/2011 | Cabanas-Holmen et al. .... 326/9 |

OTHER PUBLICATIONS

Office Action dated Jan. 22, 2014 in related U.S. Appl. No. 12/579,159, 8 pages.

Wikipedia, "Dynamic random-access memory", Sep. 30, 2009, http://en.wikipedia.org/windex.php?title=Dynamic_random_access_memory&oldid=317181940.
Bae Systems launches new space microprocessor line, Feb. 4, 2002.
Richard B. Brown et al. "Design Optimization of a Gas RISC Microprocessor with Area-InterconnectMCM Packaging" Dec. 19, 1999.
Donald C. Mayer et al."Designing Intergrated Circuits to Withstand Space Radiation" 2003, pp. 1-7.
Syed Z. Shazil et al. "Obtaining Microprocessor Vulnerability Factor Using Formal Methods" Oct. 2008, pp. 63-71.
Shinichi Yoshioka et al. A radiation-Hardened 32-bit Microprocessor Based on the Commercial CMOS Process, vol. 41, Issue 6, Dec. 1994 pp. 2481-2486.
Larry Perrine "Sandia to radiation harden Intel's 'crown jewel' Pentium processor for space and defense needs" vol. 50, No. 25 Dec. 18, 1998, pp. 1-5.
Larry Perrine"Sandia Labs to develop custom, radiation-hardened Pentium processor for space and defense needs" Dec. 8, 1998, pp. 1-7.
ScienceDaily "NASA to Have Access to Radiation-Hardend Pentium Chip" Dec. 8, 1998, pp. 1-2.
Final Office Action dated Aug. 14, 2014 in related U.S. Appl. No. 12/579,159, 51 pages.
A. Mason, "Lecture Notes Ch. 13", Spring 2008. Retrieved from http://www.egr.msu.edu/classes/ece410/mason/.
Office Action dated May 28, 2015 in U.S. Appl. No. 12/579,159; 18 pages.
Final Office Action Dated Dec. 24, 2015 in related U.S. Appl. No. 12/579,159, 29 pages.
J.R. Hauser. "Simulation of Transient Radiation Effects on CMOS ICs". Prevention of Single Event Upsets in Microelectronics, Appendix E, pp. E.1-E.10. Aug. 1991.

* cited by examiner

METHOD FOR CONVERSION OF COMMERCIAL MICROPROCESSOR TO RADIATION-HARDENED PROCESSOR AND RESULTING PROCESSOR

FIELD OF THE INVENTION

The present invention relates to a method of converting commercial microprocessors to radiation-hardened processors and, more particularly, to a method to modify a commercial microprocessor for radiation-hardened applications with minimal changes to the technology, design, device, and process base so as to facilitate a rapid transition for such radiation-hardened applications, and the resulting microprocessor.

BACKGROUND

Currently available microprocessors designed for space and military applications do not meet the performance and functional requirement integrated circuits of many proposed new systems. For example, the current offerings from manufacturers of military and space components are limited to technologies circa 150 nm and above. These offerings are limited by the intrinsic capabilities of the semiconductor facilities being used, with investment to get those fabs to state-of-the-art manufacturing being in the hundreds of millions of dollars and the operating costs and sustaining engineering costs making the investment unaffordable even for the government.

However, commercially available microprocessors meet the performance and function requirements of such space and military applications, but are not radiation hardened sufficiently for these applications. For example, commercial integrated circuits have higher performance, function, and density compared with integrated circuits designed for space and military applications; however, designs for such commercial integrated circuits result in failure caused by Single Event Upsets (SEUs) in space applications. For example, ionizing radiation in space (and ground) based applications directly upsets storage circuits, such as DRAMs, SRAMs, register files and flip-flops. Moreover, radiation events in combinational logic create voltage glitches that can be latched. Also, SEUs may cause the circuit to perform incorrect or illegal operations; whereas, an accumulation of radiation over a long period of time may additionally lead to complete device failure.

In space applications, the major radiation sources are high-energy protons and high-energy heavy ions (from helium up to about any heavy stable isotope). The high-energy cosmic protons and ions are known to produce secondary fragments which cause SEUs and single event latchups (SELs), as well as total failure resulting from total dose (long accumulation of radiation) in semiconductor ICs. Fluxes of cosmic protons and heavy ions can be estimated by models like Cosmic Ray Effects on Microelectronics (CREME) software packages.

For applications on the ground, a major source of radiation is from neutrons. These terrestrial neutrons interact with the devices and the packaging materials to produce secondary (spallation) ions that cause upsets (mainly single event upsets SEUs). The spectra of the secondary ions depend on the device back end of the line (BEOL) materials. The terrestrial neutron flux has been measured and modeled very accurately. In modern nuclear physics and high-energy physics experiments, man-made radiation environments are often generated near the microelectronics that control the detector systems, because the primary beam produces secondary particles (e.g., protons, heavy ions, pions and other particles) which can cause SEUs and SELs.

These upsets, e.g., SEUs, SELs multibit upsets (MBUs), single-bit failures and total failure, have been observed for currently available commercial device configurations (e.g., 65 nm, 45 nm, etc.). Minimizing the occurrence of such upsets with minimal change to design and process would allow the use of close derivatives of commercial components with close to commercial performance, function, and density with a minimal schedule delay. Thus, a new solution is required which meets the needs for performance and function and which also provides adequate radiation tolerance, at minimal cost and changes in current processes and designs.

Accordingly, there exists a need in the art to overcome the deficiencies and limitations described hereinabove.

SUMMARY

In a first aspect of the invention, a method implemented in a computing infrastructure comprises evaluating a probability that one or more components of an existing commercial design will be affected by a single event upset (SEU). The method further comprises replacing the one or more components with a component immune to the SEU to create a final device.

In another aspect of the invention, a method comprises: evaluating a currently available design using modeling or simulation techniques to determine whether pulse spikes cause latch ups; flattening the design to a transistor-level and organizing it into channel-connected-components (CCCs); applying a variety of Single Event Transients (SETs) to each CCC resulting in a noise pulse at an output of the each CCC; using a signal-integrity analysis tool implemented in a computing infrastructure to propagate a resulting noise pulse through logic and to each of the latches; evaluating a width of the noise pulse at an input of each of the latches; evaluating a probability of capture by a clock edge and applying a logical masking factor; determining a probability of a logic failure based on a likelihood of a soft error propagating to and switching each of the latches; and replacing each of the latches having an estimated failure rate greater than a target percentage.

In yet another aspect of the invention, a method comprises: obtaining an existing microprocessor design; targeting a low-power SOI process; performing a physical-design (PD) step with robust power distribution to provide immunity to neutron bursts; and at least one of: providing immunity to SEUs in logic portions of the microprocessor design; and providing immunity to SEUs in memory portions of the microprocessor design.

In another aspect of the invention, a memory array comprises a multiple segment memory system which is protected by an ECC scheme used as a replacement for a memory device. The multiple segment memory system transfers an ECC word to and from separate memory segments on global data lines, wherein bits of an ECC word are scattered among multiple wordlines. The wordlines are located in separate memory segments such that physical locations of each ECC bit are separated thereby protecting the memory array from radiation induced errors.

In yet another aspect of the invention, a design structure is embodied in a machine-readable medium for designing, manufacturing, or testing an integrated circuit. The design structure comprises the structures and methods of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
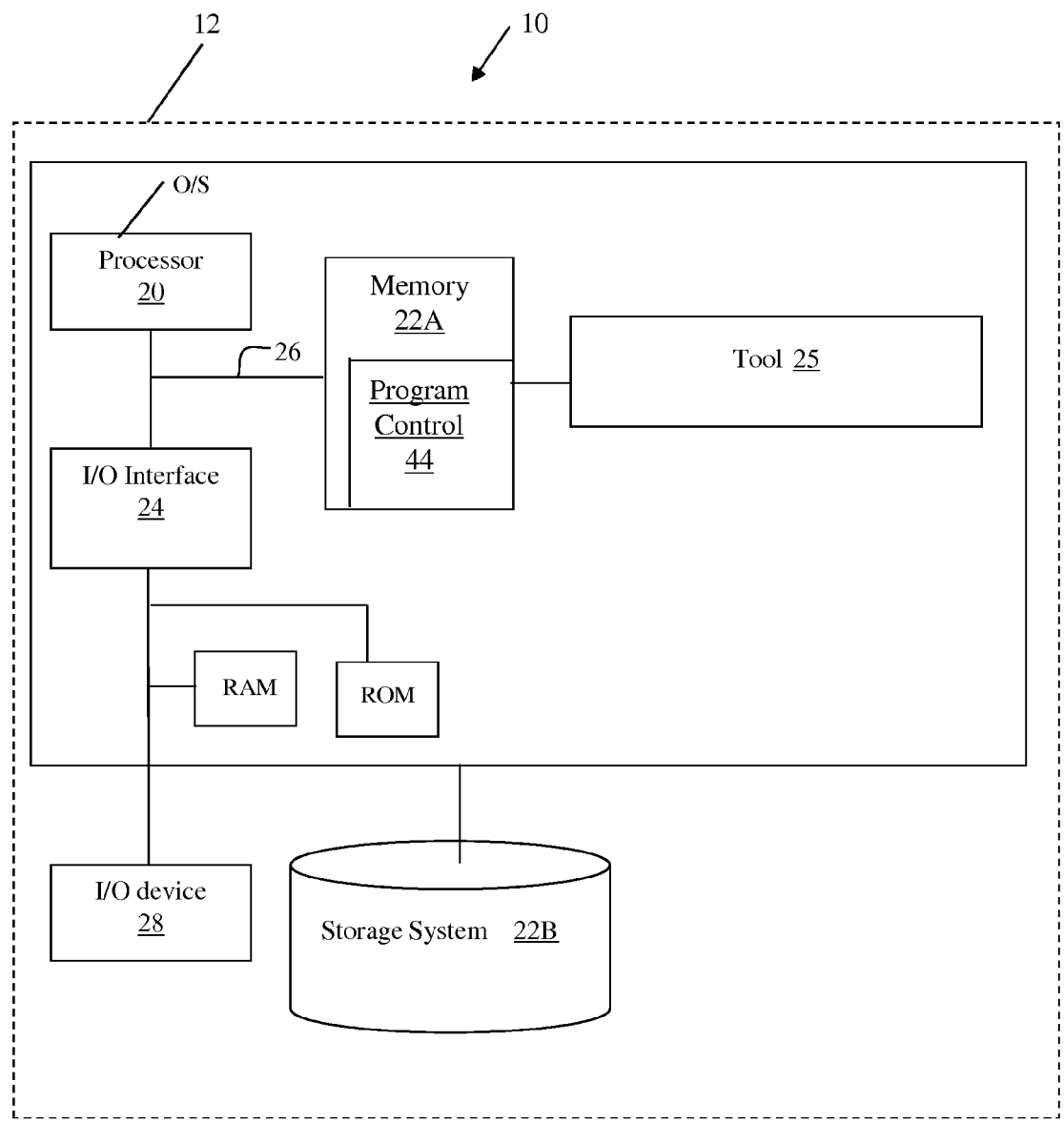
FIG. 1 shows an illustrative environment for implementing the steps in accordance with aspects of the invention.

The present invention relates to a method of converting commercial microprocessors to radiation-hardened processors and, more particularly, to a method to modify a commercial microprocessor for radiation-hardened applications with minimal changes to the technology, design, device, and process base so as to facilitate a rapid transition for such radiation-hardened applications. More specifically, the present invention provides a method to modify a commercial microprocessor for space and military requirements with minimal changes to the technology, design, device, and process base. In embodiments, the method provides a specific adaptation of a 45 nm technology as an example; however, the method equally provides specific adaptation for other technology nodes.

Advantageously, the present invention makes optimum use of existing state-of-the-art commercial capabilities produced in high volumes. The present invention uses a unique commercial manufacturing base combined with specially hardened devices with interleaved layouts to save area, a minimum number of process changes with no tooling changes, a design modified to optimize key reliability parameters for space, and/or a particular layout for ECC to minimize the effects of the multi-bit errors caused by heavy ion hits in space. In this way, the present invention obtains a high-performance microprocessor that is immune to terrestrial and non-terrestrial sources of high-energy radiation.

To accomplish the advantages of the present invention, e.g., which elements to replace in a commercial chip design to meet specific requirements, Electronic Design Automation (EDA) and/or other analysis/simulation and/or modeling tools can be implemented with the present invention. As should be understood by those of skill in the art, EDA is a category of software applications for designing and producing electronic systems ranging from printed circuit boards (PCBs) to integrated circuits. In embodiments, the designer (e.g., program control) can analyze the requirements of the chip design and, depending on the reliability grade, make one or more conversions, e.g., processes or hardened components, to meet such requirements.

In further embodiments, to meet power requirements in space, the present invention can modify commercial technologies to a lower-power nominal design point. For example, the present invention can provide a low-power derivative of SOI (LPSOI) CMOS for fabricating the radiation hardened microprocessor. In further implementations, other criteria may be to insure the device is latch-up free, e.g., convert the technology to SOI (which is latch-up free). In still further implementations, another criteria may be to convert the microprocessor resistance to neutron bursts of energy, e.g., simulating a nuclear detonation. Another criterion may be, for example, to compensate for total ionizing dose which can be improved for back-channel leakage in SOI by incorporation of the radiation-hardened buried oxide, with lateral isolation improvements.

To compensate for SEU, the present invention may incorporate radiation-hard elements into a commercial microprocessor. For example, in the case of SOI technologies, a stacked device, e.g., a two-FET device with the FETs connected in series to function as a single device, can be used to replace a regular device in critical nodes to provide SEU immunity from heavy ion upsets. A stacked device in SOI technologies is immune to SEU as it includes an insulating layer of silicon between the adjacent FETs. This can be done most easily at the design level by replacing the critical FETs with the SEU-immune stacked devices. In further embodiments, the present invention can evaluate the SEU performance of the array elements for SEUs including low-ionization-energy effects in order to augment memory arrays. For example, an Error-Correcting Code (ECC) scheme in the arrays can be augmented to the degree to meet SEUs and meet less than 1e-10 fails per bit day or better depending on system requirements. Also, in embodiments, the present invention can include ECC in smaller arrays which do not currently have ECC. The resulting processor will be radiation hard and will meet the needs for virtually all current and proposed processor applications for power, performance, and function.

In more specific embodiments, the present invention can include the following steps for converting an existing microprocessor design to a version that is immune to single-event upsets (SEUs). These steps can include, for example, obtain an existing microprocessor design;

target a low-power SOI process;

perform a physical-design (PD) step with robust power distribution to provide immunity to neutron bursts;

provide immunity to SEUs in logic portions of the microprocessor design (by identifying key devices and substituting them with an SEU-immune stacked device or by substituting every logic gate in the all or part of the design with a functionally equivalent gate composed of SEU-immune stacked devices); and provide immunity to SEUs in memory portions of the microprocessor design (by using an error correcting code (ECC) scheme to reduce sensitivity to failure of adjacent FETs in the peripheral logic of the arrays).

In this implementation, the ECC memory architecture would have multiple array segments each having a plurality of wordlines and bitlines and sense amplifiers connected to data lines which are shared between the array segments.

SYSTEM ENVIRONMENT

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following:

- an electrical connection having one or more wires,
- a portable computer diskette,
- a hard disk,
- a random access memory (RAM),
- a read-only memory (ROM),
- an erasable programmable read-only memory (EPROM or Flash memory),
- an optical fiber,
- a portable compact disc read-only memory (CDROM),
- an optical storage device,
- a transmission media such as those supporting the Internet or an intranet, or
- a magnetic storage device.

The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network. This may include, for example, a local area network (LAN) or a wide area network (WAN), or the connection may be made to an external computer (for example, through the Internet using an Internet Service Provider).

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third-party service provider (any of which is generally represented in FIG. 1).

The computing device 14 includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. The bus 26 provides a communications link between each of the components in the computing device 14. In addition, the computing device includes random access memory (RAM), a read-only memory (ROM), and an operating system (O/S). In general, the processor 20 executes computer program code (e.g., program control 44), which can be stored in the memory 22A and/or storage system 22B. The program control 44 controls and/or executes the processes of the invention. While executing the computer program code, the processor 20 can read and/or write data to/from memory 22A, storage system 22B, and/or I/O interface 24.

The computing device 14 is in communication with the external I/O device/resource 28 and the storage system 22B. For example, the I/O device 28 can comprise any device that enables an individual to interact with the computing device 14 or any device that enables the computing device 14 to communicate with one or more other computing devices using any type of communications link. The external I/O device/resource 28 may be for example, a handheld device, PDA, handset, keyboard, etc.

The computing device 14 further includes one or more analysis/simulation/modeling and/or design tools 25. For example, the tool 25 can be an EDA application, analysis tool, modeling tool and/or simulation tool implemented as one or more program code in the program control 44 stored in the memory 22A as separate or combined modules. In embodiments, chip designs, hardened components, elements, etc. may be stored in the storage system 22B, which may be, for example, a database.

The computing device 14 can also comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Exemplary Flow Diagrams

Figure 2:
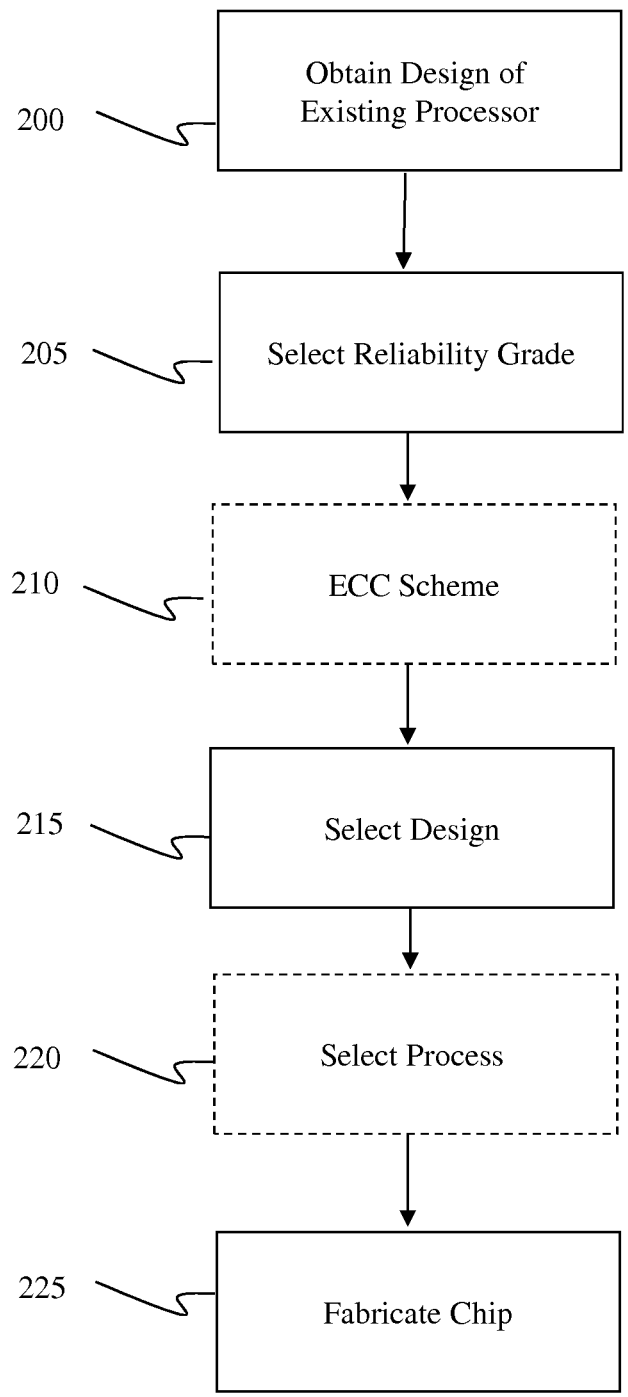
FIG. 2 shows a flow diagram used for example, in semiconductor IC logic design, in accordance with aspects of the invention.
Figure 3:
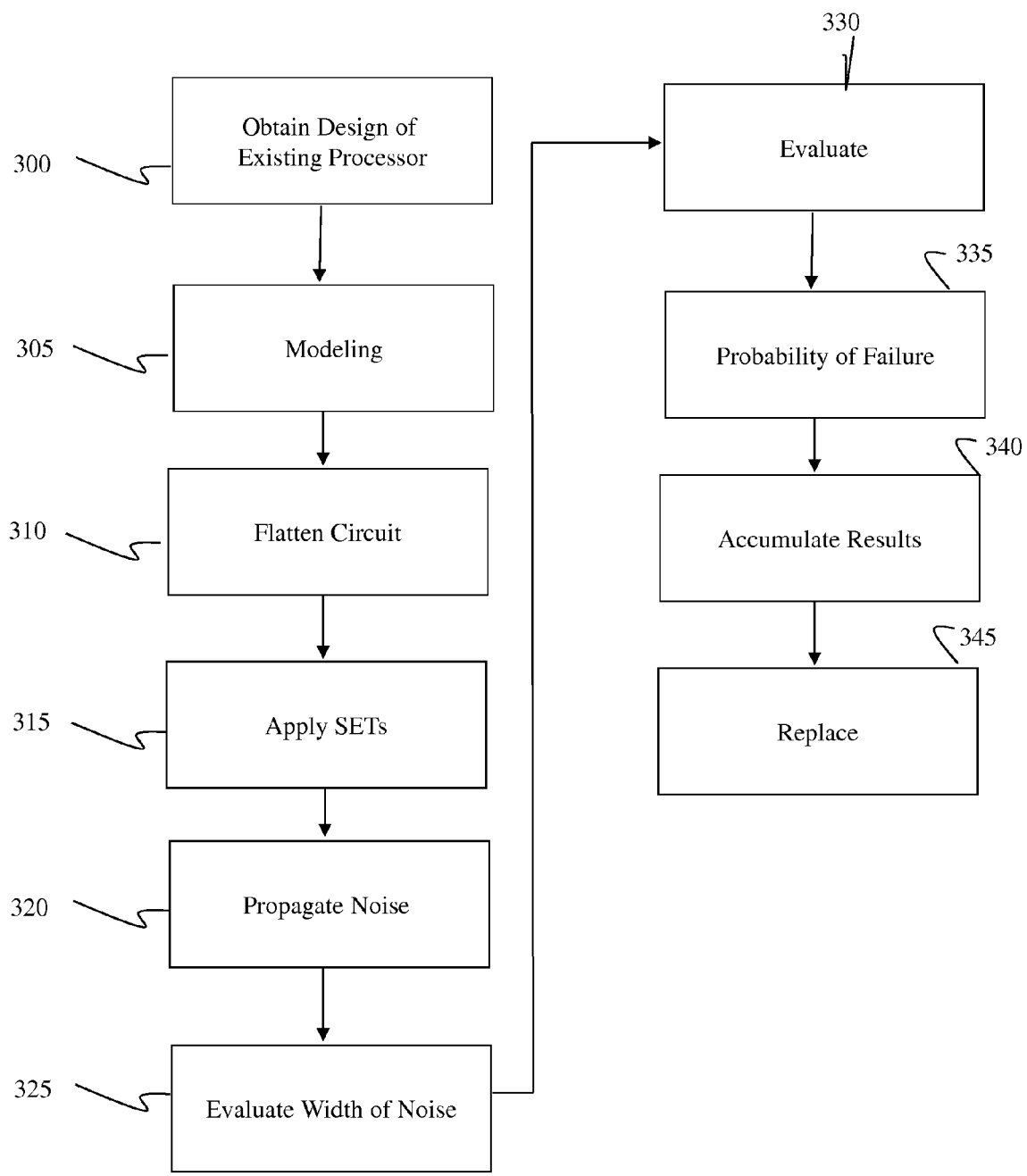
FIG. 3 shows a flow diagram describing the replacement of latches in non-array portions of an input design in accordance with aspects of the invention.

FIGS. 2 and 3 illustrate a process flow in accordance with aspects of the invention. The steps of FIGS. 2 and 3 may be implemented in the environment of FIG. 1, for example. The flow diagrams may equally represent a high-level block diagram or a swim-lane diagram of the invention. The flowchart and/or block diagrams in FIGS. 2 and 3 illustrate the architecture, functionality, and operation of possible implementations of systems, methods and computer program products according to various embodiments of the present invention. In this regard, each block in the flowchart, block diagram or swim-lane diagram may represent a module, segment, or portion of code, which comprises one or more executable instructions for implementing the specified logical function(s). It should also be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. Each block of each flowchart and combinations of the flowchart illustration can be implemented by special purpose hardware-based systems that perform the specified functions or acts, or combinations of special purpose hardware and computer instructions and/or software, as described above.

FIG. 2 shows a flow diagram used, for example, in semiconductor IC logic design in accordance with aspects of the invention. At step 200, an existing microprocessor design is obtained. The design may be, for example, Verilog/VHDL or other type of schematic. At step 205, the user (e.g., program control) can select a reliability grade, representing the desired immunity to an ionizing radiation event, for example. The reliability grade can be, for example, a numerical score (e.g., 1-5), where 1 is the highest grade (most reliability). The reliability grade may be based on a desired radiation hardness required by the design and, in embodiments, may take into account many different tradeoffs such as, for example, cost, efficiency and size of the final design. In more specific examples, factors to consider for the reliability grade may include, amongst others:
  failure over a predetermined time period;
  packaging materials that produce secondary (spallation) ions that cause SEUs;
  failure rate to a specific flux;
  reliability of the final design, e.g., 100% reliability vs. 50% reliability;
  cost of the final design;
  size of the final design; and/or
  probability of failure at certain energy levels of the final design.

Optional step 210 is provided specifically for a memory array. For example, in optional step 210, the present invention can use an Error Correction Code (ECC) scheme for a DRAM or SRAM in order to improve robustness of the memory array, e.g., reliability of the memory. For example, the present invention can use a novel ECC scheme to improve the radiation immunity of DRAM or SRAM memory chips. As should be understood by those of skill in the art, the ECC is denser than a stacked transistor memory cell, but will use more power than the stacked transistor memory cell. A detailed discussion of the ECC scheme is described with reference to FIGS. 4 and 5.

At step 215, a design choice can be selected by the program control, based on the selected reliability grade. Step 215 can include, for example, providing immunity to SEUs in the logic portions of the commercial design by identifying key devices and substituting them with an SEU-immune device or by substituting every logic gate in all or part of the design with a functionally equivalent gate composed of SEU-immune devices. In a more specific example, the design can include, amongst other substitutions: a triple modular redundancy; substitution of every transistor by a stacked device for complementary CMOS gates (e.g., as disclosed in application Ser. No. 12/408,205, filed on Mar. 20, 2009, which is incorporated by reference in its entirety herein); substitution of every latch with a DICE latch; and/or substitution of only the sensitive latches with an equivalent latch having stacked devices. Another example may include targeting of SOI technologies which are resistant to latch up. As should be known to those of skill in the art, there may be many tradeoffs between each of the above designs. For example, the replacement of each transistor by a stacked device will require a significantly larger, and hence more expensive, chip, but such design will also be the most reliable against SEUs.

At optional step 220, the program control selects a process enhancement such as, for example, silicon-rich-oxide (SRO) film. As should be understood by those of skill in the art, the SRO film can be an efficient and reliable tunneling injector for the low voltage application in a flash memory cell. In an ionization event, electrons (negative charges) and holes (positive charges) are generated within an oxide layer. For a regular silicon oxide layer, some of the generated charges can accumulate in the oxide layer and cause degradation in device characteristics, resulting in the circuits not to function properly. For a silicon-rich-oxide layer, the charges generated in it can leak out readily with negligible net charge accumulation in the oxide layer. At step 225, the chip is fabricated, using the selected design. The resulting combination will provide radiation hardened chips with much better combined power, density, function, and reliability than is available using currently used methods. The method is also scalable and will provide cost savings without the need for large capital investment and extensive and unique process development.

FIG. 3 shows a flow diagram describing the replacement of latches in non-array portions of an input design in accordance with aspects of the invention. In embodiments, the evaluation of the circuits can be repeated to evaluate charged particles from each known source. These sources can be, for example: (i) fragments from neutron interactions; (ii) alpha particles; (iii) wafer materials background; (iv) solder bump materials; and/or (v) packaging materials, amongst other sources. The steps of FIG. 3 are performed using an estimate of the number of particles of different types emitted by the sources in (i)-(v) above.

At step 300, the program control will obtain a commercially available design. At step 305, the program control uses charge-collection modeling, bipolar modeling, and/or circuit simulation to estimate amplitudes of Single Event Transients (SETs). In embodiments, the modeling and/or simulation are represented by the tool 25 of FIG. 1. The modeling and/or simulation are designed to determine the narrow pulse created by charge collected in combinational logic and captured by a clock edge, and the frequency of occurrence of the SETs. By way of example, an analysis tool (also represented as tool 25 of FIG. 1) such as, for example, Synopsys Primetime SI, can determine if pulse spikes propagate to an interconnect, gate silicon and inverter to a latch data input. If so, the program control can check whether the latch data input is being clocked to determine if the latch should be replaced.

More specifically, soft errors in logic circuits may be filtered out by the circuit itself and may not affect the circuit performance if the noise pulse hits a non-controlling pin to a logic gate. For instance, if a two input NAND gate has a 0 on one input, a 1 will be produced on the output, regardless of any input on the other input pin. Accordingly, it does not matter if the other input pin is subject to large or little noise, as that noise will be filtered and will not appear on the output of the NAND gate. Not taking this noise-filtering into account will make a failure analysis too conservative, and may improperly increase the determined probability of failure at a latch. Thus, the method of masking fails due to the state of the logic includes using switching factors or switching activity values to calculate a probability that any input will be in a controlling or non-controlling state. The program control of the present invention will use the same type of masking to determine switching probability as used in power analysis.

In particular, at step 310, the program control will flatten the circuit under test to the transistor-level and organize it into channel-connected-components (CCCs). At step 315, the program control will apply a variety of SETs to each CCC (appropriate for each CCC), each resulting in a noise pulse at the output of the CCC. At step 320, the program control will use a signal-integrity analysis tool (also represented as tool 25 of FIG. 1), improved with the use of current-source models for the CCC, to propagate the resulting noise pulse through logic and to latches. At step 325, the program control will evaluate the width of the SET noise pulse at the input of a latch. At step 330, the program control will evaluate the probability of capture by a clock edge and apply a logic masking factor. Logic masking factors may be determined from a variety of sources, including, for example: the use of simulation data to determine the probability that any signal is in a controlling or non-controlling state; the use of global switching factors to estimate the probability that any logic signal is in a controlling or non-controlling state; or per-instance estimated factors, which relate an individual noisy input signal to the number of other inputs to a circuit it propagates to, to compute a probability that the other inputs may be in a non-controlling state. For instance, with a 2 input NAND circuit, the other input has a 1/2 probability of being non-controlling, and the factor would be 1/2. A 3 input NAND would have a factor of 1/4; etc.

At step 335, the program control will determine the probability of a logic failure based on the likelihood of a soft error propagating to and switching each latch. At step 340, the program control will accumulate results for each instance (i)-(v) to obtain a failure estimate for each latch. At step 345, the program control will replace each latch having an estimated failure rate greater than the target percentage. In embodiments, the target percentage may be a user-defined percentage.

The replacement of latches in the non-array portions of the input design (commercially available design) may be based on the reliability grade selected by the program control or designer, as discussed above. In the example described in FIG. 3, for a high reliability grade (high reliability device), every device may be replaced by a stacked device. For a lower reliability grade (lower reliability device), only the latches with a functionally equivalent latch having stacked devices or a DICE latches that have a likelihood of failure >x % will be replaced. Here, the value of "x" can be a user-defined percentage describing the degree of desired "hardening".

Figure 4:
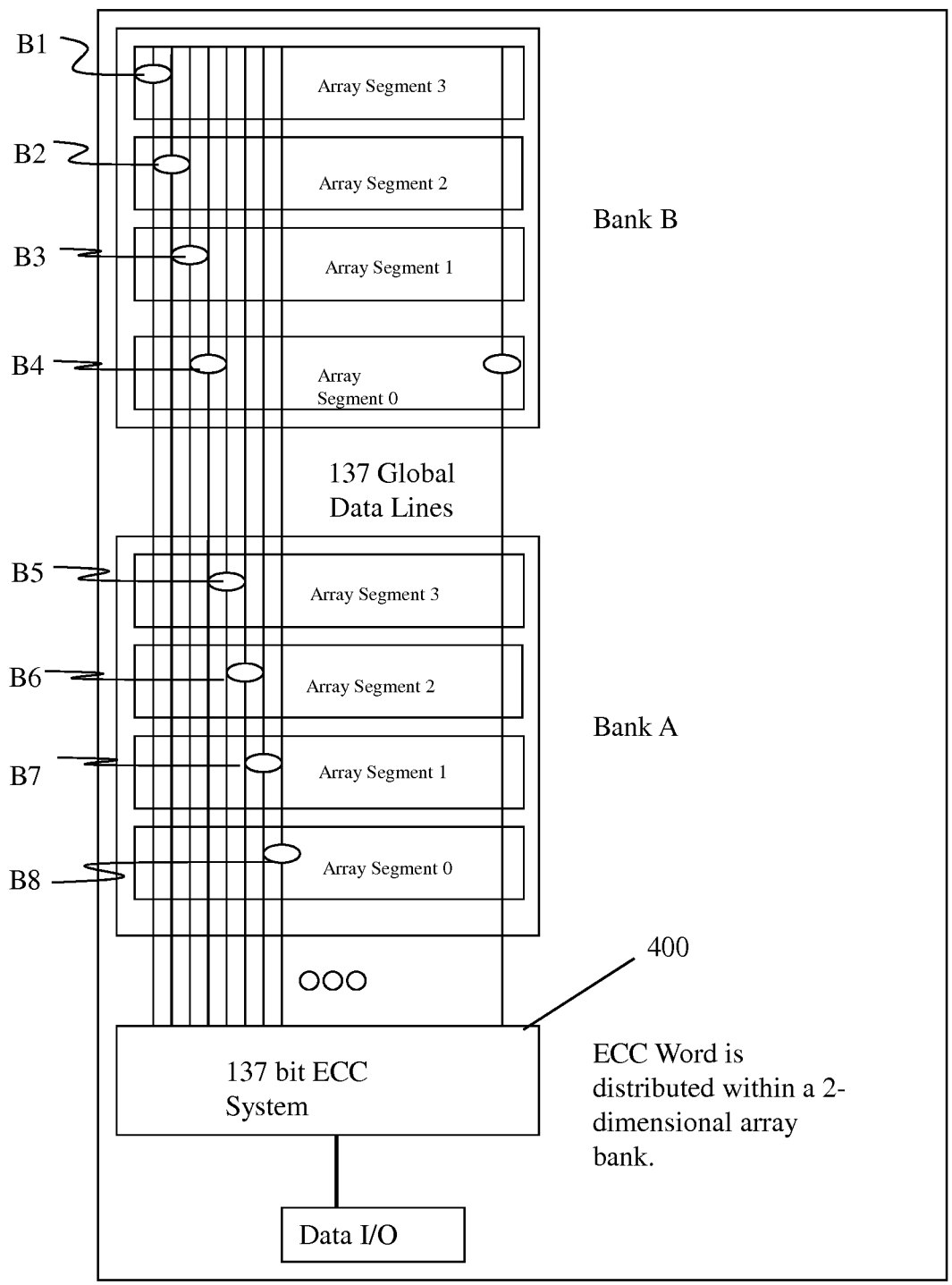
FIG. 4 shows a two-bank memory system which is protected by a 137-bit ECC system in accordance with aspects of the present invention.

FIG. 4 shows a two-bank memory system protected by a 137-bit ECC scheme in accordance with aspects of the present invention. The two-bank memory system shown in FIG. 4, for example, can be used as a replacement for a memory device, in step 210 of FIG. 2. Illustratively, by using the two-bank memory system of FIG. 4, it is possible to protect the memory array against radiation-induced soft errors and neutrino switching effects, for example, and hence recover from a single error. For example, as discussed in more detail below, recovery from a single error is possible by using a two dimensional array to store data bits in different word lines that are spaced far apart in order to spread data over a large area.

By way of background, single event upsets (SEU) are a significant problem for DRAM (dynamic random access memory) and SRAM (static random access memory) arrays in aerospace applications. To protect the memory in conventional systems, Error Correction Code (ECC) systems have been added to improve the radiation immunity of DRAM memory chips to perform a single error correct and double error correct (SEC/DEC) operations. However, in such systems, 8-groups of separate ECC words are inter-digitated along a 1096 bit word line, and arranged so the 137-bits defining one electrical ECC word are separated by 8-physical bits. In this arrangement, a single SEU can affect up to 8 adjacent DRAM cells and still be correctable by the SEC/DEC system. However, the physical size of the memory storage cell is small enough that a single particle strike can generate an electron cloud sufficient to destroy the data within a large grouping of DRAM cells. For this reason, known techniques of interdigitating the ECC word are by themselves not sufficient to provide significant immunity to radiation. An additional problem with known techniques is that DRAM arrays have much shorter word lines than the currently used 16 MB technology. Shorter word lines, in turn, make it difficult to physically separate the ECC bits far enough apart to minimize the effects of a SEU, with efficient ECC codes of 64 to 128 data bits per ECC word. A need therefore exists to improve the SEU immunity of a DRAM array used in a radiation hardened application.

To improve current technologies, the memory architecture shown in FIG. 4 comprises an ECC word stored in a two-dimensional space to minimize SEU effects on a DRAM array. In this arrangement, the interdigitation technique is augmented by spacing out the electrical locations of a single ECC word to several word lines residing in several array segments.

More specifically, FIG. 4 shows a two-bank memory system (e.g., Bank A and Bank B) protected by a 137-bit ECC system 400 designed to transfer an ECC word to and from the memory banks on an overhead global data line. The 137 bit ECC system includes 9 check bits. For Bank B, the 137-bit ECC word 400 has a first bit, B1, located in array segment 3, and subsequent bits B2, B3, B4 are located in array segments 2, 1 and 0, respectively. For Bank A, the 137-bit ECC word 400 has a first bit, B5, located in array segment 3, and subsequent bits B6, B7, B8 are located in array segments 2, 1 and 0, respectively. Thus, in this arrangement, the physical locations of each bit are scattered along an array wordline segment and across a plurality of array segments such that a SEU is unlikely to affect more than 1 bit with the ECC word.

In this arrangement, the ECC protected memory architecture has the improvement over the known systems of simply storing the ECC word in interdigitated locations along a word line. That is, in this configuration, the physical location of an electrical ECC word can be spread out within a memory array in a two-dimensional fashion to minimize the effects of radiation. In this manner, the SEU damage is confined to a single bit residing in several ECC words and is therefore recoverable by a SEC/DEC system (because the ECC word is spread out over several array segments). (This is compared to a conventional system where in a SEU, an electron cloud could affect the data integrity of a large group of memory cells within a single ECC word.)

Figure 5:
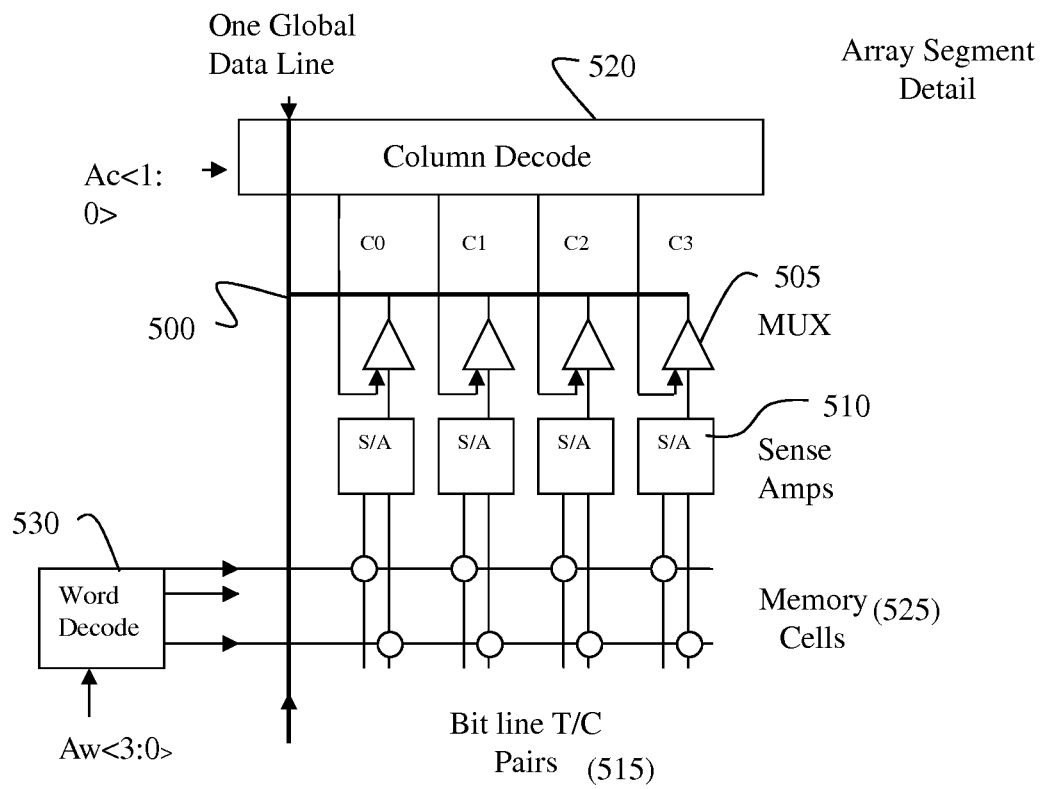
FIG. 5 shows a detail of the array segment used in FIG. 4.

FIG. 5 shows a detail of the array segment used in FIG. 4. In the arrangement shown, within each array segment, a 1-of-4 decode is performed by a column select signal Ac<1:0> to select a DRAM cell location within the array segments. More specifically, an overhead global data line 500 is connected to 1-of-4 MUX devices 505 and column select logic to select a particular sense amp 510 and bit line pair 515. The MUX devices 505 are responsive to a column decode 520 controlled by addresses Ac<1:0>, and also allow data to pass from the sense amps 510 to the global data line 500. A particular memory cell 525 is selected along a true/complement pair of array bit lines by the word decoder 530 with input Aw<3:0>. Using multiple of these array segments allows an ECC word to be scattered across a multiple bank memory array to minimize the effects of a SEU and can essentially eliminate data loss from a SEU event.

Figure 6:
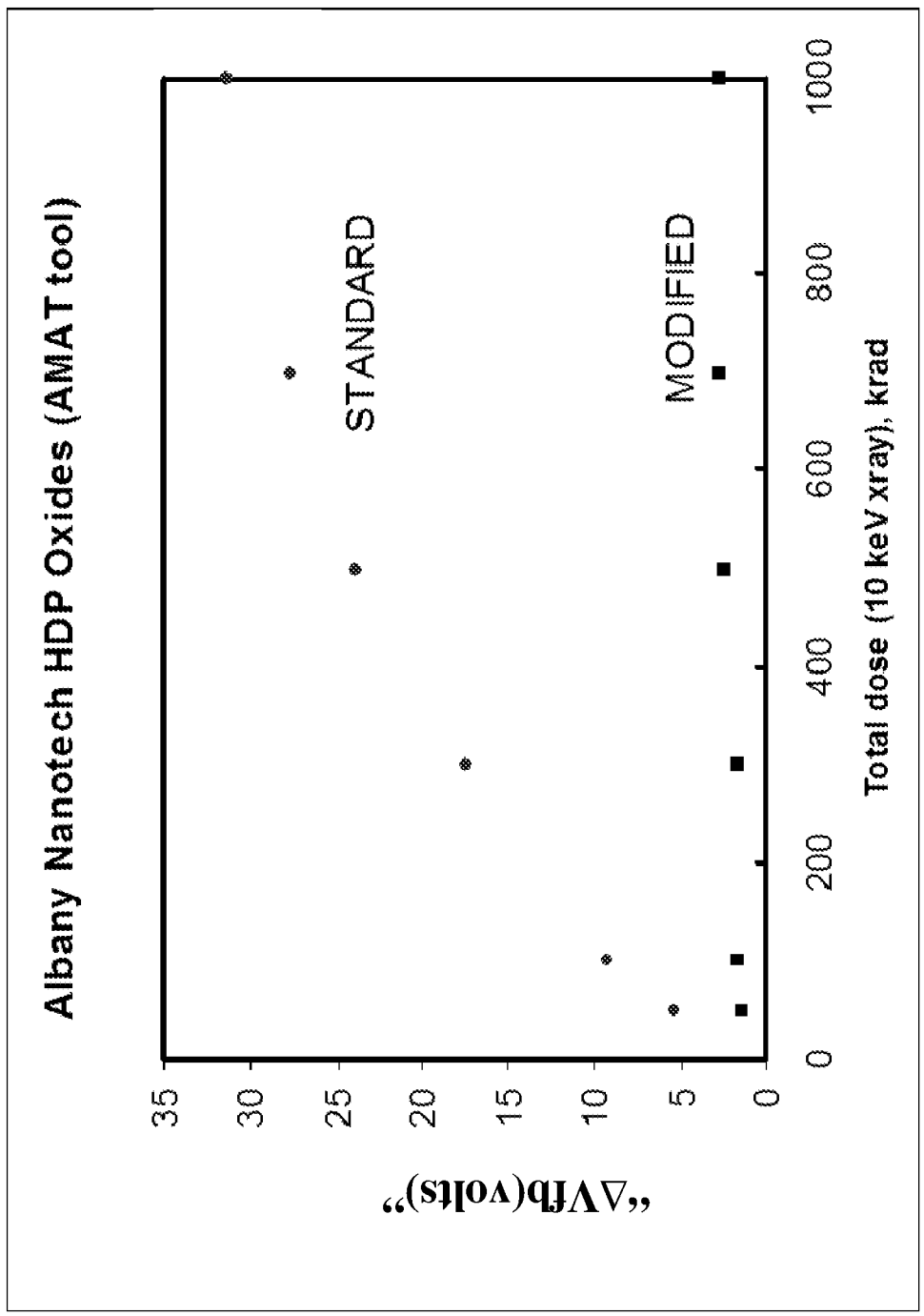
FIG. 6 shows a graph of oxide films comparing voltage shift as a function of total dose in accordance with aspects of the invention.

In another example, the total ionizing dose (TID) resistance can be provided by use of a method to reduce backchannel and lateral isolation leakage. One example is the use of Silicon Rich Oxide (SRO). Another example is the use of liners in the STI fill. These examples can be achieved in an existing tool with a change to the gas flow during oxide deposition. More specifically, in one implementation, TID enhancement can include the deposition of High Refractive Index Silicon Rich Silicon Dioxide using an AMAT 5000 HDP (High Density Plasma) system. The leakage properties of this silicon rich oxide film are far superior to conventional $SiO_2$ following Total Ionizing Dose exposure (see, e.g., FIG. 6). The SRO has no known harmful effects on NFET and PFET leakage characteristics and greatly improves the TID results.

Figure 7:
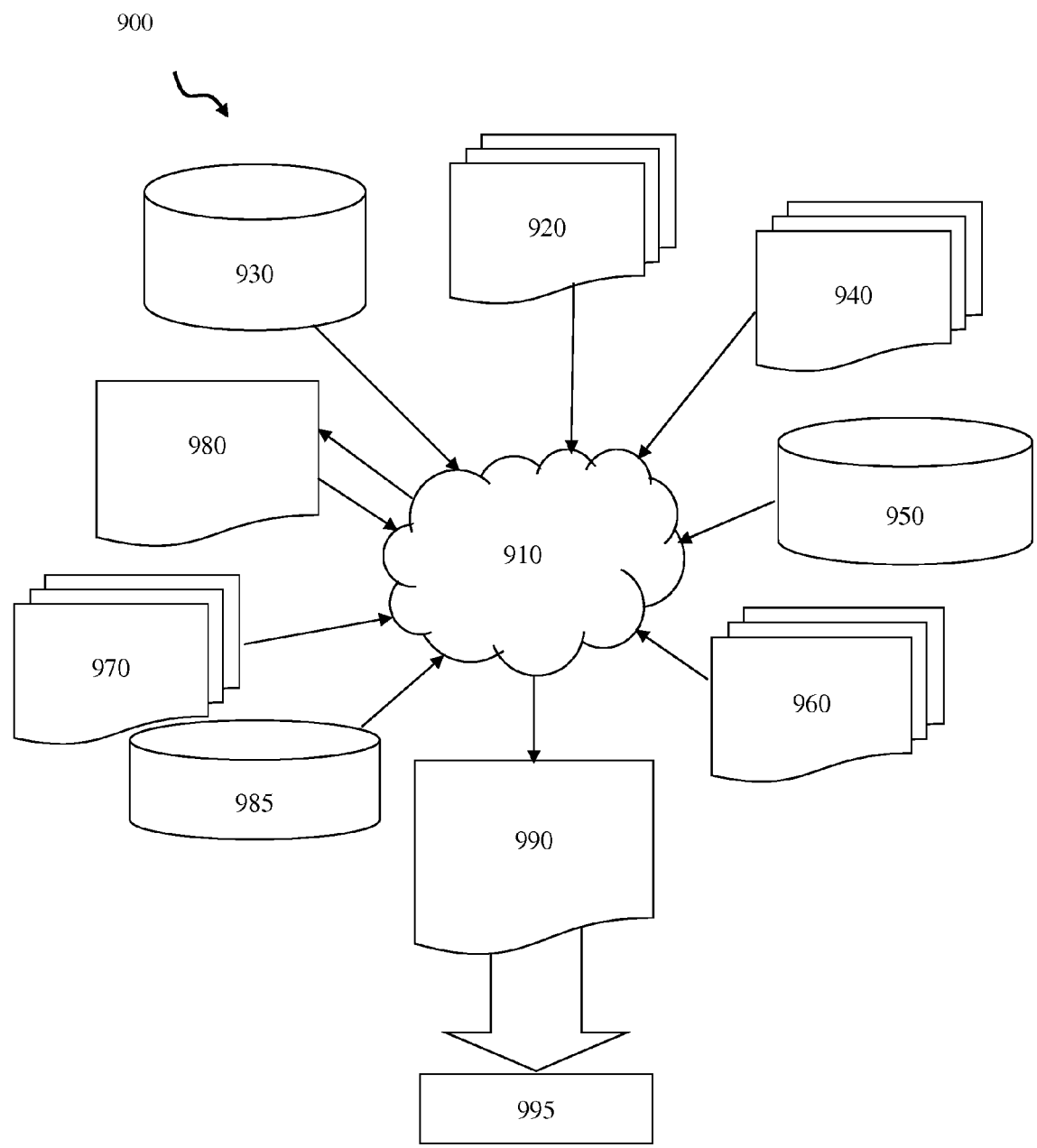
FIG. 7 is a flow diagram of a design process used in semiconductor design, manufacture, and/or test.

FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5, for example, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5, for example. In one embodiment, design structure 990 may comprise a compiled, executable HDL simulation model that functionally simulates the devices shown in FIGS. 1-5, for example.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5, for example. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method implemented in a computing infrastructure, comprising:
   obtaining an existing available microprocessor design;
   selecting a reliability grade for a desired level of immunity for an ionizing radiation event;
   evaluating a probability that one or more components of the existing available microprocessor design will be affected by a single event upset (SEU) using a computing device, the evaluating comprising:
      estimating amplitudes of single event transients (SETs) to determine whether a latch needs to be replaced;
      identifying latches in non-array portions of the existing available microprocessor design;
      flattening the existing available microprocessor design to a transistor level;

organizing the existing available microprocessor design into channel-connected-components (CCCs);

applying the SETs to each of the CCCs, each resulting in a noise pulse at an output for each CCC;

propagating a resulting noise pulse from the CCCs to the latches;

determining a probability of a logic failure based on a likelihood of a soft error propagating to and switching each identified latch for each known source of charged particles, wherein the determining of the probability is performed by evaluating charged particles from each known source within the existing available microprocessor design;

accumulating results for each known source of the charged particles;

obtaining a failure estimate for each identified latch based on the accumulated results; and identifying each latch having an estimated failure rate greater than a target percentage;

selecting a design choice based on the reliability grade for replacing the one or more components from the design choices comprising: a triple modular redundancy, a substitution of every transistor by a stacked device for complementary CMOS gates in SOI technologies which are resistant to latch up, a substitution of every latch with a DICE latch, and a substitution of only sensitive latches with an equivalent latch having at least one stacked device in SOI technologies which are resistant to latch up;

selecting a process enhancement to provide an immune device; and replacing the one or more components in the existing available processor design, including each latch having the estimated failure rate greater than the target percentage, with a component immune to the SEU based on the selected design choice to create a final microprocessor design, wherein the reliability grade takes into account different factors including failure over a predetermined time period, failure rate to a specific flux, reliability of the final microprocessor design, cost of the final microprocessor design, size of the microprocessor design, and probability of failure at certain energy levels.

2. The method of claim 1, wherein:

sensitive areas of logic of the existing available microprocessor design are rendered immune to the SEU by substituting logic gates containing at least one stacked device;

all digital logic of the existing available microprocessor design are rendered immune to the SEU by substituting logic gates containing at least one stacked field effect transistor (FET) device; and SRAM and DRAM arrays are rendered immune to the SEU by use of Error Correction Code (ECC) in peripheral logic of the arrays.

3. The method of claim 1, wherein the reliability grade takes into account different factors including efficiency of the final microprocessor design.

4. The method of claim 1, further comprising using an Error Correction Code (ECC) scheme for a DRAM or SRAM to improve robustness of a memory array, wherein the ECC scheme includes physical locations of each bit scattered along an array segment and within a plurality of array segments.

5. The method of claim 1, wherein the replacement includes providing immunity to the final device in logic portions by substituting every logic gate in all or part of the existing available microprocessor design with a functionally equivalent gate composed of SEU-immune devices.

6. The method of claim 1, wherein the process enhancement includes a silicon-rich-oxide (SRO) film.

7. The method of claim 1, wherein the evaluating the charged particles from each known source comprises repeating the evaluating for (i) fragments from neutron interactions, (ii) alpha particles, (iii) wafer material background, (iv) solder bump material, and (v) packaging materials.

8. The method of claim 1, wherein the reliability grade represents a desired radiation hardness required by the final microprocessor design.

9. The method of claim 8, wherein the selecting the design choice comprises identifying key one or more components and replacing the key one or more components from the design choices comprising: a triple modular redundancy, a substitution of every transistor by a stacked device for complementary CMOS gates in SOI technologies which are resistant to latch up, a substitution of every latch with a DICE latch, and a substitution of only sensitive latches with an equivalent latch having at least one stacked device in SOI technologies which are resistant to latch up.

10. The method of claim 8, wherein the reliability grade further comprises a first reliability grade requiring every device be replaced by the stacked device and a second reliability grade requiring only latches with a functionally equivalent latch having the stacked device or the DICE latch that have the estimated failure rate greater than the target percentage will be replaced.

11. The method of claim 1, wherein the evaluating the probability that the one or more components of the existing available microprocessor design will be affected by the SEU further comprises:

using at least one of charge-collection modeling, bipolar modeling, and circuit simulation to perform the estimating the amplitudes of the SET;

propagating the noise pulse through logic and to the latches;

evaluating a width of the noise pulse at an input of the latches; and evaluating a probability of capture by a clock edge and applying a logic masking factor determined from a probability that any signal is in a controlling or non-controlling state.

12. The method of claim 1, wherein the reliability grade is a numerical score representing the desired level of immunity for the ionizing radiation event, and the numerical score corresponds with the probability of failure at certain energy levels of the final microprocessor design.

13. A method comprising:

obtaining an existing available microprocessor design;

selecting a reliability grade for a desired level of immunity for an ionizing radiation event;

targeting a low-power process in the existing available microprocessor design; and performing a physical-design (PD) step with robust power distribution to provide immunity to neutron bursts, wherein the robust power distribution includes:

providing immunity to single event upsets (SEUs) in logic portions of the existing available microprocessor design using a computing device, wherein the providing the immunity to the SEUs in the logic portions comprises:

identifying latches in the logic portions of the existing available microprocessor design;

evaluating charged particles from each known source within the existing available microprocessor design;
determining a probability of a logic failure based on a likelihood of a soft error propagating to and switching each identified latch;
accumulating results for each known source of charged particles to obtain a failure estimate for each identified latch; and
identifying each latch having an estimated failure rate greater than a target percentage; and
providing immunity to SEUs in memory portions of the existing available microprocessor design comprising:
using an Error Correction Code (ECC) scheme for a DRAM or SRAM to improve robustness of a memory array, wherein the ECC scheme includes physical locations of each bit scattered along an array segment and within a plurality of array segments,
wherein the providing the immunity to the SEUs in the logic portions further comprises:
selecting a design choice based on the reliability grade for replacing one or more key devices in the logic portions from the design choices comprising: a triple modular redundancy, a substitution of every transistor by a stacked device for complementary CMOS gates in SOI technologies which are resistant to latch up, a substitution of every latch with a DICE latch, and a substitution of only sensitive latches with an equivalent latch having at least one stacked device in SOI technologies which are resistant to latch up; and
replacing the one or more key devices in the available microprocessor design including each latch having the estimated failure rate greater than the target percentage with a device immune to the SEUs based on the selected design choice to create a final microprocessor design, and
wherein the reliability grade takes into account different factors including failure over a predetermined time period, failure rate to a specific flux, reliability of the final microprocessor design, cost of the microprocessor design, size of the final microprocessor design, and probability of failure at certain energy levels.

14. A method implemented in a computing infrastructure, comprising:
obtaining an existing available microprocessor design;
selecting a reliability grade for a desired level of immunity for an ionizing radiation event;
evaluating a probability that one or more components of the existing available microprocessor design will be affected by a single event upset (SEU) using a computing device, the evaluating comprising:
estimating amplitudes of single event transients (SETs) to determine whether a latch needs to be replaced;
identifying latches in non-array portions of the existing available microprocessor design;
flattening the existing available microprocessor design to a transistor level;
organizing the existing available microprocessor design into channel-connected-components (CCCs);
applying the SETs to each of the CCCs, each resulting in a noise pulse at an output for each CCC;
propagating a resulting noise pulse from the CCCs to the latches;
determining a probability of logic failure based on a likelihood of a soft error propagating to and switching each identified latch for each known source of charged particles, wherein the determining of the probability is performed by evaluating charged particles from each known source within the existing available microprocessor design;
accumulating results for each known source of the charged particles;
obtaining a failure estimate for each identified latch based on the accumulated results; and
identifying each latch having an estimated failure rate greater than a target percentage;
selecting a design choice based on the reliability grade for replacing the one or more components from the design choices comprising; a triple modular redundancy, a substitution of every transistor by a stacked device for complementary CMOS gates in SOI technologies which are resistant to latch up, a substitution of every latch with a DICE latch, and a substitution of only sensitive latches with an equivalent latch having at least one stacked device in SOI technologies which are resistant to latch up;
selecting a process enhancement to provide an immune device; and
replacing the one or more components in the existing available processor design, including each latch having the estimated failure rate greater than the target percentage, with a component immune to the SEU based on the Selected design choice to create a final microprocessor design,
wherein the evaluating the probability that the one or more components of the existing available microprocessor design will be affected by the SEU further comprises;
using at least one of charge-collection modeling, bipolar modeling, and circuit simulation to perform the estimating the amplitudes of the SET;
propagating the noise pulse through logic and to the latches;
evaluating, a width of the noise pulse at an input of the latches: and
evaluating a probability of capture by a clock edge and applying a logic masking factor determined from probability that any signal is in a controlling or non-controlling state, and
wherein the logic masking factor is determined by simulation data to determine the probability that any signal is in the controlling or the non-controlling state, global switching factors to estimate the probability that any logic signal is in the controlling or the non-controlling state, and per-instance estimated factors, which relate to an individual noisy input signal to a number of other inputs to a circuit it propagates to, to compute a probability that the other inputs are in the non-controlling state.

* * * * *